(12) United States Patent
Matsuzawa

(10) Patent No.: US 7,148,537 B2
(45) Date of Patent: Dec. 12, 2006

(54) SEMICONDUCTOR MEMORY DEVICE

(75) Inventor: Kazuya Matsuzawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 84 days.

(21) Appl. No.: 11/068,986

(22) Filed: Mar. 2, 2005

(65) Prior Publication Data

US 2005/0230742 A1   Oct. 20, 2005

(30) Foreign Application Priority Data

Mar. 29, 2004   (JP) .............................. 2004-094980

(51) Int. Cl.
*H01L 29/76* (2006.01)

(52) U.S. Cl. ...................... 257/314; 257/315
(58) Field of Classification Search ................ 257/314, 257/315, 323, 324; 438/201, 211, 257
See application file for complete search history.

(56) References Cited

FOREIGN PATENT DOCUMENTS

| JP | 3420165 | 4/2003 |
|----|---------|--------|
| JP | 2003-203998 | 7/2003 |

OTHER PUBLICATIONS

Sandip Tiwari, et al., "Straddle-Gate Transistor: Changing MOSFET Channel Length Between Off-and On-State Towards Achieving Tunneling-Defined Limit of Field-Effect", IEEE, 1998, 4 Pages.

*Primary Examiner*—Douglas W. Owens
(74) *Attorney, Agent, or Firm*—Oblon, Spivak, McClelland, Maier & Neustadt, P.C.

(57) ABSTRACT

A semiconductor memory device includes a semiconductor substrate, a gate insulating film on the semiconductor substrate, a gate electrode on the gate insulating film, control insulating films formed on both side faces in a gate length direction of the gate electrode, charge storage layers formed on both the side faces via the control insulating films, a tunnel insulating film formed between the charge storage layers and the semiconductor substrate, and source/drain regions between which the gate electrode and the charge storage layers are interposed, and which are formed in a surface of the semiconductor substrate. Preferably, fixed information is stored depending on presence/absence of an impurity diffusion layer formed in a surface portion of the semiconductor substrate directly under the tunnel insulating film, semi-fixed information is stored depending on an amount of charges in the charge storage layers, and charges opposite to the charges are induced in the surface portion.

20 Claims, 13 Drawing Sheets

SEMICONDUCTOR MEMORY DEVICE

CROSS-REFERENCE TO RELATED APPLICATIONS

This application is based upon and claims the benefit of priority from the prior Japanese Patent Applications No. 2004-094980, filed on Mar. 29, 2004; the entire contents of which are incorporated herein by reference.

BACKGROUND OF THE INVENTION

1. Field of the Invention

The present invention relates to a nonvolatile semiconductor memory device.

2. Description of the Related Art

A nonvolatile semiconductor memory device can hold information without a power supply, and hence is widely used in various devices such as a portable information device. In many information devices, permanent information which is stored at factory shipment (for the sake of convenience, hereinafter referred to as "fixed information") is stored in a memory such as a mask ROM (Read Only Memory), and information which is to be written and rewritten in a stage where the user uses the information (for the sake of convenience, hereinafter referred to as "semi-fixed information") is stored in an EEPROM (Electrically Erasable Programmable ROM) or the like.

Usually, an EEPROM comprises a charge storage layer between a gate electrode and a semiconductor substrate to store charges, thereby storing semi-fixed information. This storing process uses a phenomenon that, when charges in the charge storage layer are negative, the amount of ON-current is decreased, and, when the charges are positive, the amount of ON-current is increased. As a charge storage layer, useful is a floating gate formed by a conductor surrounded by an insulating layer, a MONOS (Metal-Oxide-Nitride-Oxide-Semiconductor) layer structure formed by a stack of insulating layers and conductive layers, an MNOS (Metal-Nitride-Oxide-Semiconductor) layer structure, or the like.

Conventionally, fixed information and semi-fixed information cannot be stored in the same element. Therefore, a mask ROM region and an EEPROM region are separately mounted in an information device. As a result, there arise problems in that a nonvolatile semiconductor memory device occupies a larger area, and that such a device has a complicated configuration.

Therefore, a configuration in which fixed information and semi-fixed information are stored in the same storage element has been proposed (see Japanese Patent No. 3,420,165). The storage of fixed information is carried out depending on whether a source impurity diffusion layer exists or not in a storage element, based on a phenomenon that the amount of ON-current is small in an EEPROM having no source impurity diffusion layer. Semi-fixed information is stored depending on the amount of charges in a charge storage layer in the same manner as a usual EEPROM.

The operation of reading semi-fixed information is conducted by reversing the source and the drain. When the roles of source and drain are reversed, previously stored fixed information is changed so as to depend on the presence/absence of a drain impurity diffusion layer. As compared with the presence/absence of a source impurity diffusion layer and the positive/negative of charges in a charge storage layer, the presence/absence of a drain impurity diffusion layer less affects the amount of ON-current. Therefore, the ON-current is most affected by the positive/negative of charges in a charge storage layer, and can reflect the semi-fixed information with high ON/OFF characteristics.

However, the reversion of source and drain means that a further restriction must be imposed on the circuit design, and often causes the circuit to be complicated.

On the other hand, a storage element has been proposed in which a charge storage layer is formed on side faces of a gate electrode on both the source and drain sides, and charges are stored in each of the charge storage layers to store 2-bit semi-fixed information. However, the proposed storage element has a problem in that charges in the charge storage layers on the source and drain sides mutually affect each other and hence has low ON/OFF characteristics.

Therefore, a method of improving ON/OFF characteristics in a configuration where charge storage layers are formed by a stack structure such as MONOS or MNOS has been proposed (see JP-A-2003-203998). In the proposed method, in writing and reading operations, a voltage is applied to the gate electrode in the course of voltage application between the source/drain regions. However, this method requires means for controlling the timing of the voltage application, and hence has a problem in that the structure of a storage element is complicated and enlarged.

SUMMARY OF THE INVENTION

According to an aspect of the present invention, a semiconductor memory device has: a semiconductor substrate; a gate insulating film on the semiconductor substrate; a gate electrode on the gate insulating film; control insulating films which are formed on both side faces in a gate length direction of the gate electrode, respectively; charge storage layers which are formed on both the side faces in the gate length direction of the gate electrode via the control insulating films, respectively; a tunnel insulating film which is formed between the charge storage layers and the semiconductor substrate; and source/drain regions between which the gate electrode and the charge storage layers are interposed in the gate length direction, and which are formed in a surface of the semiconductor substrate. Preferably, fixed information is stored depending on presence/absence of an impurity diffusion layer formed in a surface portion of the semiconductor substrate directly under the tunnel insulating film, semi-fixed information is stored depending on an amount of charges in the charge storage layers, and charges which are opposite in polarity to charges in the charge storage layers are induced in a surface portion of the semiconductor substrate directly under the tunnel insulating film.

According to another aspect of the present invention, a semiconductor memory device has: a semiconductor substrate; a first gate insulating film on the semiconductor substrate, and a second gate insulating film under the semiconductor substrate; a first gate electrode on the first gate insulating film, and a second gate electrode under the second gate insulating film; first charge storage layers which are formed on both side faces in a gate length direction of the first gate electrode via control insulating films, respectively; second charge storage layers which are formed on both side faces in a gate length direction of the second gate electrode via control insulating films, respectively; a first tunnel insulating film which is formed between the first charge storage layers and the semiconductor substrate; and a second tunnel insulating film which is formed between the second charge storage layers and the semiconductor substrate. Preferably, source/drain regions between which the first and second gate electrodes and the first and second charge storage layers are interposed in the gate length direction are formed in a surface of the semiconductor substrate, impurity diffusion layers are formed between the first and second tunnel insulating films, in the semiconductor substrate, and charges which are opposite in polarity to charges in the first charge storage layers, and charges which are opposite in polarity to charges in the second charge storage layers are induced in surface portions of the semiconductor substrate directly under the first and second tunnel insulating films, respectively.

According to the invention, it is possible to provide a semiconductor memory device in which great restrictions are not imposed on the circuit design, fixed information and semi-fixed information can be stored in the same element, and excellent ON/OFF characteristics are attained by a simple structure.

DETAILED DESCRIPTION OF THE INVENTION

Figure 1A:
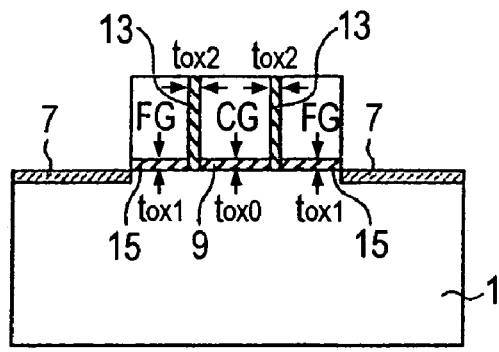
FIGS. 1A to 1D are sectional diagrams of a storage element in a first embodiment, taken in the gate length direction.

Hereinafter, embodiments of the invention will be described with reference to the accompanying drawings. In the embodiments, identical components are denoted by the same reference numerals, and duplicate description will be omitted. The figures are diagrams for illustrating the invention and facilitating the understanding of the invention. Although the shapes, dimensions, and dimension ratios shown in the figures may be different from those of an actual device, they can be adequately modified in consideration of the following description and known techniques.

First Embodiment

A storage element in a first embodiment will be described with reference to FIGS. 1A to 1D. A storage element is a minimum unit which independently performs a specific function in a storage device, and a storage device is a device which is formed by integrating such storage elements.

FIGS. 1A to 1D are sectional diagrams illustrating the storage element in the first embodiment, taken in the gate length direction. For the sake of convenience, a state where the amount of ON-current of the storage element is small is set as 1-state, and that where the amount of ON-current is large is set as 0-state. A case where a charge storage layer is formed by a floating gate made of a conductor which is surrounded by an insulating layer will be described.

First, a storage element in which only fixed information at factory shipment is stored will be described. FIG. 1A shows the storage element in which the fixed information is in 1-state (hereinafter, referred to as fixed information (1)), and FIG. 1B shows the storage element in which the fixed information is in 0-state (hereinafter, referred to as fixed information (0)).

In the storage element of fixed information (1), as shown in FIG. 1A, a channel region is in the surface of a semiconductor substrate 1, and a gate electrode (in the figure, indicated by CG) is formed on the channel region via a gate insulating film 9. Charge storage layers (in the figure, indicated by FG) are formed on both the side faces in the gate length direction of the gate electrode (CG) via control insulating films 13, respectively. A tunnel insulating film 15 is formed with being interposed between the charge storage layers (FG) and the semiconductor substrate 1. Metal silicide layers 7 are formed in the surface of the semiconductor substrate 1 so that the source charge storage layer (FG), the gate electrode (CG), and the drain charge storage layer (FG) are interposed between the metal silicide layers.

Figure 1B:
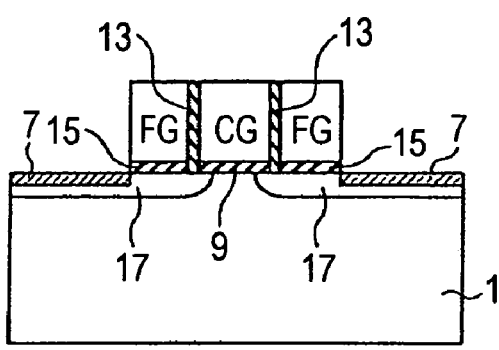

As shown in FIG. 1B, the storage element of fixed information (0) is identical with that of fixed information (1) of FIG. 1A except that impurity diffusion layers 17 are formed so as to sandwich the gate electrode (CG), to a position which is deeper than the metal silicide layers 7 in the surface of the semiconductor substrate 1.

An operation of reading fixed information will be described.

As compared with the storage element of fixed information (0) shown in FIG. 1B, the storage element of fixed information (1) of FIG. 1A has a larger source-drain distance, and a thicker Schottky barrier between the metal silicide layers 7 and the semiconductor substrate 1. Therefore, ON-current hardly flows in the storage element of fixed information (1), and ON-current flows in that of fixed information (0) so that the storage element can reflect the fixed information.

As a specific example, a storage element in which the gate insulating film has a thickness of $t_{ox0}$=1 nm, the tunnel insulating film has a thickness of $t_{ox1}$=8 nm, the control insulating films has a thickness of $t_{ox2}$=15 nm, the gate electrode (CG) has a length of 130 nm, the charge storage layers (FG) have a length of 20 nm, and the gate electrode (CG) has a height of 60 nm will be described.

In the storage elements of fixed information (1) and fixed information (0), a voltage of 2.5 V is applied to the gate electrode (CG), and that of 2.5 V is applied between the source/drain regions. In the former element, ON-current hardly flows, and, in the latter one, ON-current of about 0.5 to 1 mA flows. In this way, each storage element reflects the stored fixed information.

Writing of fixed information is conducted by forming or not forming the impurity diffusion layers 17 as shown in FIGS. 1A and 1B. The forming method will be described in detail in the later description of a method of producing the storage element in the first embodiment.

Next, a storage element which stores semi-fixed information as a result of a writing/rewriting operation conducted by the user will be described. For the sake of convenience, description will be made on a storage element in which stored semi-fixed information is different from stored fixed information.

Figure 1C:
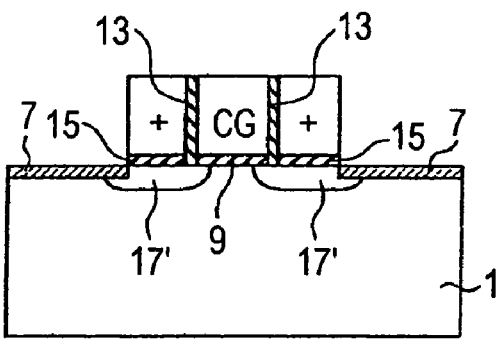
Figure 1D:
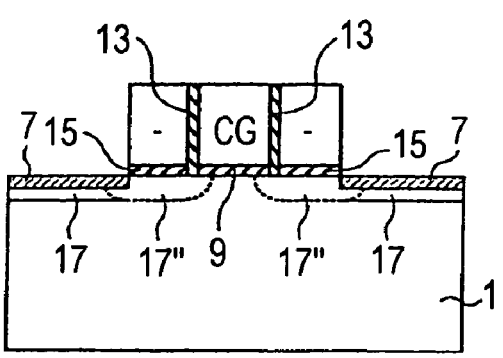

FIG. 1C shows the storage element in which fixed information (1), and the semi-fixed information is in 0-state (hereinafter, referred to as semi-fixed information (0)) and FIG. 1D shows the storage element in which fixed information (0), and the semi-fixed information is in 1-state (hereinafter, referred to as semi-fixed information (1)).

An operation of reading semi-fixed information will be described.

As shown in FIG. 1C, in the storage element of fixed information (1) and semi-fixed information (0) shown in FIG. 1A, positive charges are stored in the charge storage layers (FG), and therefore electrons are attracted toward surface portions of the semiconductor substrate 1 which are directly under the charge storage layers (FG), whereby pseudo impurity diffusion layers 17' are formed. The positive charges stored in the charge storage layers (FG) cause the Schottky barriers between the metal silicide layers 7 and the semiconductor substrate 1 to be thinned, thereby enabling ON-current to flow. As a result, the storage element can reflect the semi-fixed information.

As shown in FIG. 1D, in the storage element of fixed information (0) shown in FIG. 1B, negative charges are stored in the charge storage layers (FG), and therefore electrons in the impurity diffusion layers 17 are repelled to form depleted impurity diffusion layers 17". Moreover, the Schottky barriers between the metal silicide layers 7 and the semiconductor substrate 1 are thick. Therefore, ON-current hardly flows, and the storage element can reflect the semi-fixed information.

As a specific example, the above-mentioned storage element will be described. When a voltage of 2.5 V is applied to the gate electrode (CG), and that of 2.5 V is applied between the source/drain regions, ON-current of about 0.5 to 1 mA flows in the storage element of fixed information (1) and semi-fixed information (0), and ON-current hardly flows in the storage element of fixed information (0) and semi-fixed information (1). In this way, each storage element reflects the stored semi-fixed information.

In the first embodiment, the charge storage layers (FG) are formed on both the side faces in the gate length direction of the gate electrode (CG), respectively, and the pseudo impurity diffusion layers 17' and the depleted impurity diffusion layers 17" are formed, whereby the ON/OFF characteristics of semi-fixed information can be improved. Moreover, the metal silicide layers are used as the source/drain regions, and the thickness of the Schottky barriers is controlled, whereby the ON/OFF characteristics of semi-fixed information can be further improved.

Even in a storage element having the same semi-fixed information, the amount of ON-current in the case where semi-fixed information different from fixed information is written is different from that in the case where semi-fixed information identical with fixed information is written.

Specifically, when negative charges are stored in the charge storage layers (FG) of the storage element of fixed information (1) shown in FIG. 1A to write semi-fixed information (1), the amount of ON-current is further decreased, and, when positive charges are stored in the charge storage layers (FG) of the storage element of fixed information (0) shown in FIG. 1B to write semi-fixed information (0), the amount of ON-current is further increased. Therefore, the amount of ON-current is smaller in the sequence of the storage element of fixed information (1) and semi-fixed information (1), that of fixed information (0) and semi-fixed information (1), that of fixed information (1) and semi-fixed information (0), and that of semi-fixed information (0) and fixed information (0). When the memory device is adequately designed, the former two storage elements may be isolated from the latter two ones so as to store two values, so that only semi-fixed information can be read. Alternatively, all the storage elements may be isolated from one another, so that fixed information and semi-fixed information can be simultaneously read. In the latter case, information at factory shipment, and information which has been written or rewritten by the user can be simultaneously compared with each other.

Next, an operation of writing semi-fixed information will be described. Semi-fixed information is written by storing charges into the charge storage layers (FG). In the writing of semi-fixed information, the quantum mechanical tunnel phenomenon is used.

First, a method of storing positive charges into the charge storage layers (FG) will be described.

In the storage element which has been exemplarily described above, for example, the charge storage layers (FG) are set to an excessive erasure state of 2 V. Voltages of −20 V and 0 V are applied for 0.1 ms to the gate electrode (CG), and the source/drain regions, respectively, whereby electrons are pushed out of the charge storage layers (FG) into the semiconductor substrate 1 through the tunnel insulating film 15. As a result, the charge storage layers (FG) are in the electron deficient state, and positive charges are stored into the charge storage layers (FG).

Next, a method of storing negative charges into the charge storage layers (FG) will be described.

In the storage element which has been exemplarily described above, for example, the charge storage layers (FG) are set to a writing state of −2 V. Voltages of +20 V and 0 V are applied for 0.1 ms to the gate electrode (CG), and the source/drain regions, respectively, whereby electrons are injected from the semiconductor substrate 1 into the charge storage layers (FG) through the tunnel insulating film 15. As a result, electrons are written into the charge storage layers (FG) to store negative charges into the charge storage layers (FG).

The source charge storage layer (FG), and the drain charge storage layer (FG) may be independently controlled by means of thermal electron injection or the like.

Hereinafter, preferred modes of the storage element will be described.

The source/drain regions are preferably made of a compound which cooperates with the semiconductor substrate 1 to form a Schottky junction, such as the above-mentioned metal silicide layers 7, or a metal. Alternatively, the source/drain regions may be formed by a heavily-doped impurity diffusion layer or the like.

The charge storage layers are preferably formed by floating gates as described above because charges can be easily controlled. Alternatively, the MONOS layer structure, the MNOS layer structure, or the like may used in the charge storage layers.

In the case where the charge storage layers are formed by floating gates (FG), preferably, the thickness $t_{ox2}$ of each of the control insulating films 13 is larger than the thickness $t_{ox1}$ of the tunnel insulating film 15, and the area $S_2$ of each of the control insulating films 13 is larger than the area $S_1$ of the tunnel insulating film 15.

The thickness $t_{ox2}$ of the control insulating film 13 indicates the distance between the gate electrode (CG) and the respective one of the charge storage layers (FG) via the control insulating film 13, and the area $S_2$ of the control insulating film 13 indicates the area of a plane through which the gate electrode (CG) opposes the charge storage layer (FG) via the control insulating film 13. The thickness $t_{ox1}$ of the tunnel insulating film 15 indicates the distance between the semiconductor substrate 1 and the respective one of the charge storage layers (FG) via the tunnel insulating film 15, and the area $S_1$ of the tunnel insulating film 15 indicates the area of a plane through which the semiconductor substrate opposes the charge storage layer (FG).

From the viewpoint of the easiness of the operations of writing electrons into and erasing from the charge storage layers (FG), preferably, the thickness $t_{ox1}$ of the tunnel insulating film 15 is made thin. In order to suppress escape of charges from the charge storage layer (FG) to the gate electrode (CG), the thickness $t_{ox2}$ of the control insulating film 13 is preferably larger than the thickness $t_{ox1}$ of the tunnel insulating film 15, or the relationship of $t_{ox2} > t_{ox1}$ is preferably set.

By contrast, in order to conduct the operations of writing electrons into and erasing from the charge storage layers (FG) at a high efficiency, the potential of the gate electrode (CG) must be efficiently transferred to the charge storage layer (FG). When the capacitance of the control insulating film 13 is $C_2$ and that of the tunnel insulating film 15 is $C_1$, therefore, the relationship of $C_2 > C_1$ is preferably set. Usually, when the capacitance is C, the area is S, the thickness is t, and the dielectric constant is k, the relationship of $C = kS/t$ is established. Therefore, the area $S_2$ of the control insulating film 13 and the area $S_1$ of the tunnel insulating film 15 are determined so as to satisfy the relationship of $S_2/t_{ox2} > S_1/t_{ox1}$.

When $t_{ox1}$, $t_{ox2}$, $S_1$, and $S_2$ are adjusted in this way, the capacitance coupling ratio $(Cr = C_2/(C_1 + C_2))$ is large, and charges can be easily stored into the charge storage layer (FG). Alternatively, the relationship of $C_2 > C_1$ may be realized by adjusting the dielectric constants of the control insulating film 13 and the tunnel insulating film 15.

Next, an example of a method of producing the storage element in the first embodiment will be described with reference to FIGS. 2 to 11. For the sake of convenience, description will be made on a storage element in which the charge storage layers are formed by floating gates.

Figure 2:
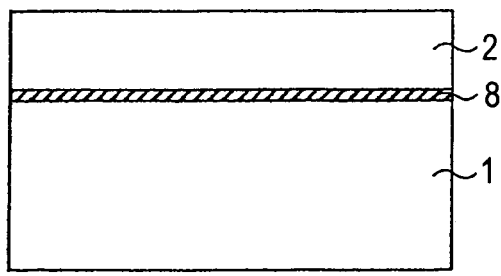
FIG. 2 is a sectional diagram showing a first step of a process of producing the storage element in the first embodiment, taken in the gate length direction.

As shown in FIG. 2, in a first step, the surface of the p-semiconductor substrate 1 (Si) is thermally oxidized to form a gate insulating film precursor layer 8 ($SiO_2$). Then, a gate electrode precursor layer 2 (poly-Si) is deposited on the gate insulating film precursor layer 8 ($SiO_2$) with using a known film forming method such as CVD (Chemical Vapor Deposition), sputtering, or MBE (Molecular Beam Epitaxy), and the gate electrode precursor layer 2 (poly-Si) is doped with P to set the layer to the n type by ion implantation using $POCl_3$ gas or the like.

Figure 3:
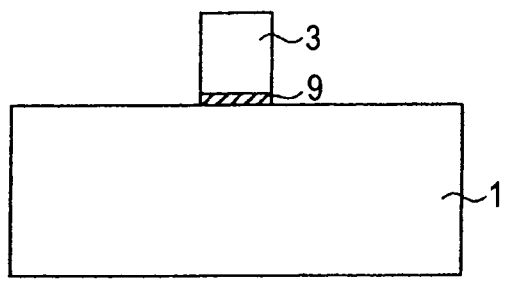
FIG. 3 is a sectional diagram showing a second step of the process of producing the storage element in the first embodiment, taken in the gate length direction.

As shown in FIG. 3, in a second step, the gate insulating film precursor layer 8 ($SiO_2$) and the gate electrode precursor layer 2 (poly-Si) are processed by anisotropic etching to form a gate insulating film 9 ($SiO_2$) and a gate electrode 3 (poly-Si).

Figure 4A:
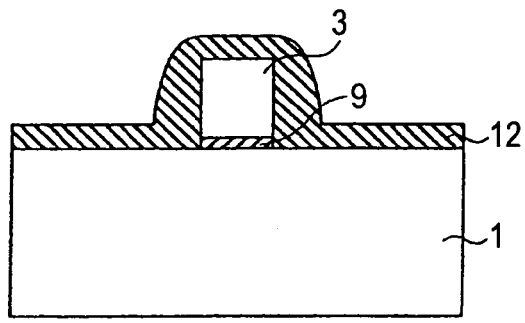
FIGS. 4A and 4B are sectional diagrams showing a third step of the process of producing the storage element in the first embodiment, taken in the gate length direction.
Figure 4B:
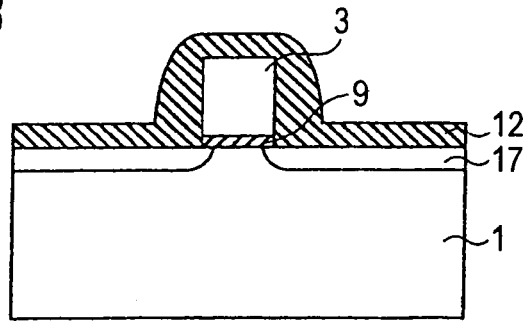

As shown in FIGS. 4A and 4B, in a third step, fixed information is written according to whether the impurity diffusion layers 17 are formed or not. Then, a control insulating film precursor layer 12 (SiN) is deposited. FIG. 4A shows a storage element in which the impurity diffusion layers 17 are not to be formed. FIG. 4B shows a storage element in which the impurity diffusion layers 17 are formed by doping the surface of the semiconductor substrate 1 with As by ion implantation of $As^+$ at an energy of several tens of kV, and then conducting an activating process by RTA (Rapid Thermal Anneal) at 900° C. for about 30 seconds.

For the sake of convenience, hereinafter, steps of producing the storage element shown in FIG. 4A in which the impurity diffusion layers 17 are not to be formed will be described.

Figure 5:
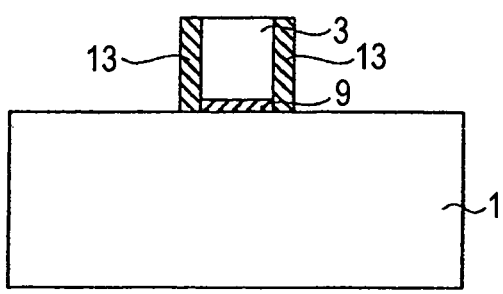
FIG. 5 is a sectional diagram showing a fourth step of the process of producing the storage element in the first embodiment, taken in the gate length direction.

As shown in FIG. 5, in a fourth step, the control insulating film precursor layer 12 (SiN) is processed by anisotropic etching to form the control insulating films 13 (SiN) on the side walls of the gate electrode 3 (poly-Si), respectively.

Figure 6:
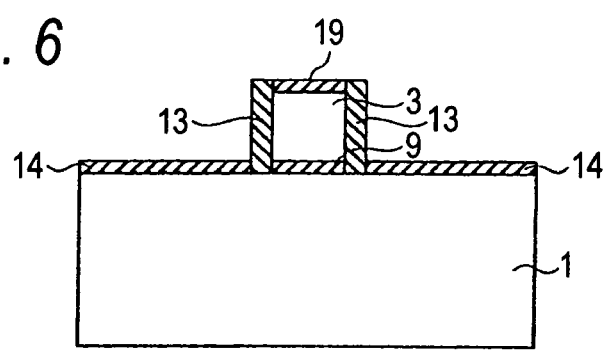
FIG. 6 is a sectional diagram showing a fifth step of the process of producing the storage element in the first embodiment, taken in the gate length direction.

As shown in FIG. 6, in a fifth step, a tunnel insulating film precursor layer 14 ($SiO_2$) is formed in the surface of the semiconductor substrate 1 (Si) by thermal oxidation. In this step, an $SiO_2$ layer 19 is formed also in the surface of the gate electrode 3 (poly-Si).

Figure 7:
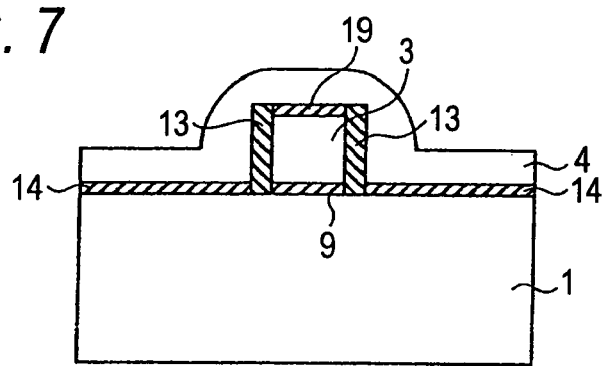
FIG. 7 is a sectional diagram showing a sixth step of the process of producing the storage element in the first embodiment, taken in the gate length direction.

As shown in FIG. 7, in a sixth step, a charge storage layer precursor layer 4 (poly-Si) is deposited, and the charge storage layer precursor layer 4 (poly-Si) is then doped with P to set the layer to the n type by ion implantation using $POCl_3$ gas or the like.

Figure 8:
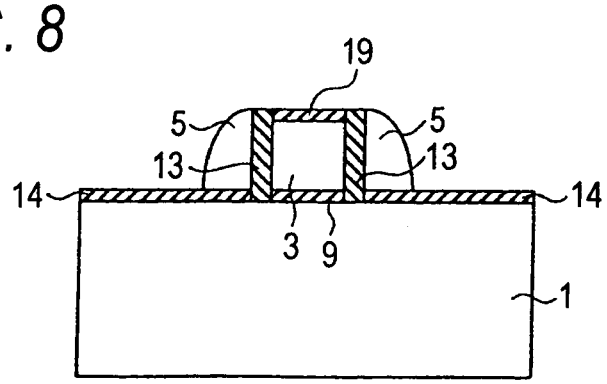
FIG. 8 is a sectional diagram showing a seventh step of the process of producing the storage element in the first embodiment, taken in the gate length direction.

As shown in FIG. 8, in a seventh step, the charge storage layer precursor layer 4 (poly-Si) is processed by anisotropic etching to form charge storage layers 5 (poly-Si) so as to sandwich the control insulating films 13 (SiN) in the gate length direction.

Figure 9:
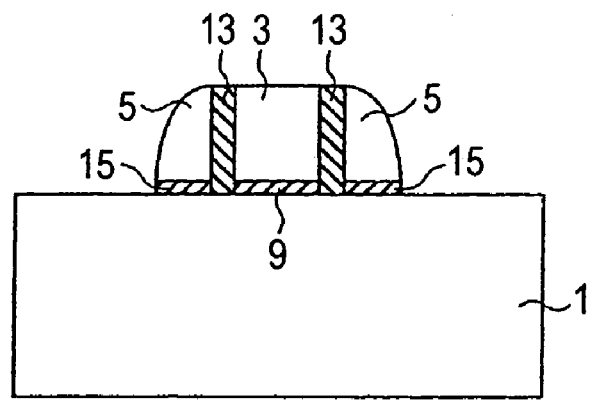
FIG. 9 is a sectional diagram showing an eighth step of the process of producing the storage element in the first embodiment, taken in the gate length direction.

As shown in FIG. 9, in an eighth step, the tunnel insulating film precursor layer 14 ($SiO_2$) and an $SiO_2$ layer which are exposed are removed away by etching.

Figure 10:
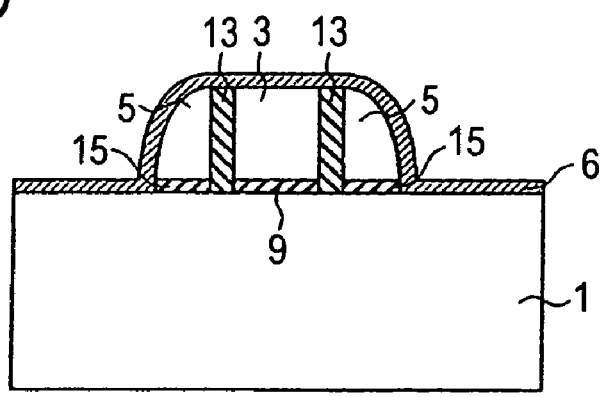
FIG. 10 is a sectional diagram showing a ninth step of the process of producing the storage element in the first embodiment, taken in the gate length direction.

As shown in FIG. 10, in a ninth step, a metal silicide precursor layer 6 (Co) is deposited.

Figure 11:
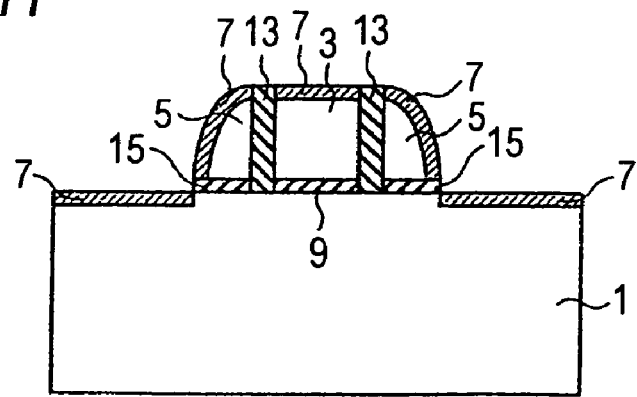
FIG. 11 is a sectional diagram showing a tenth step of the process of producing the storage element in the first embodiment, taken in the gate length direction.

As shown in FIG. 11, in a tenth step, the metal silicide precursor layer 6 (Co) which is in contact with the Si region is caused to undergo a silicide reaction by an annealing process, thereby forming the metal silicide layers 7 ($CoSi_2$). Thereafter, the unreacted Co is removed away.

As a result of the above-described steps, the storage element in the first embodiment is produced.

Next, the materials of the first embodiment will be described.

For the sake of convenience, description will be made on the materials of the storage element shown in FIG. 11.

As the material of the semiconductor substrate 1, Si, SiGe, Ge, strained Si, or the like is used.

As the material of the channel region, Si, SiGe, Ge, strained Si, or another channel region material is used. Preferably, an impurity such as B, P, or As is adequately added to the material so that, in the case of a p-MOSFET, the channel region is preferably set to the n type, and, in the case of an n-MOSFET, the channel region is preferably set to the p type.

As the material of the gate insulating film 9, a silicon oxide film, a high dielectric constant insulating film (an insulating film material which is higher in dielectric constant than a silicon oxide film), a mixture of these materials, or the like is used. As the material of the high dielectric constant insulating film, a metal silicate (a material which is obtained by adding metal ions to a silicon oxide) such as Zr silicate or Hf silicate, or $Si_3N_4$, $Al_2O_3$, $Ta_2O_5$, $TiO_2$, $La_2O_5$, $CeO_2$, $ZrO_2$, $HfO_2$, $SrTiO_3$, $Pr_2O_3$, or the like is used.

As the material of the control insulating films 13, an insulating material such as SiN is used. Preferably, SiN is used because SiN has an effect of suppressing an impurity from being dispersed into the gate stack structure in a post process.

As the material of the tunnel insulating film 15, an insulating material such as $SiO_2$ is used.

As the material of the gate electrode 3, polycrystalline silicon (poly-Si), a semiconductor compound such as SiGe, a refractory metal, a refractory metallic compound, or the like is used.

As the material of the charge storage layers 5, the same material as that of the gate electrode 3 is used.

As the material of the metal silicide layers 7, a silicide of a metal such as V, Cr, Mn, Y, Mo, Ru, Rh, Hf, Ta, W, Ir, Co, Ti, Pt, Pd, Zr, Gd, Dy, Ho, or Er is used.

The impurity diffusion layers 17 are set to have a conductivity type which is different from that of the channel region.

The materials of storage elements of embodiments and modifications which will be described later are adequately selected with reference to those described in the first embodiment.

Hereinafter, modification 1.1 will be described with reference to FIGS. 12A to 12D. For the sake of simplicity, only portions which are different from those of the first embodiment will be described.

Figure 12A:
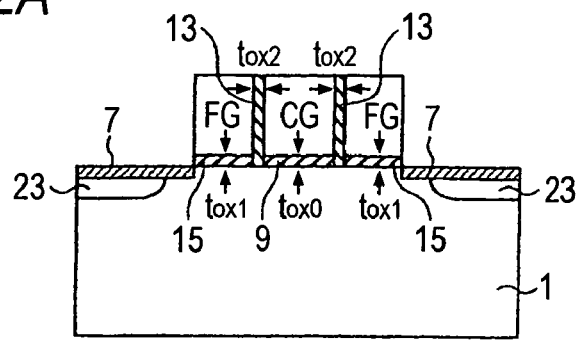
FIGS. 12A to 12D are sectional diagrams of a storage element in modification 1.1, taken in the gate length direction.
Figure 12B:
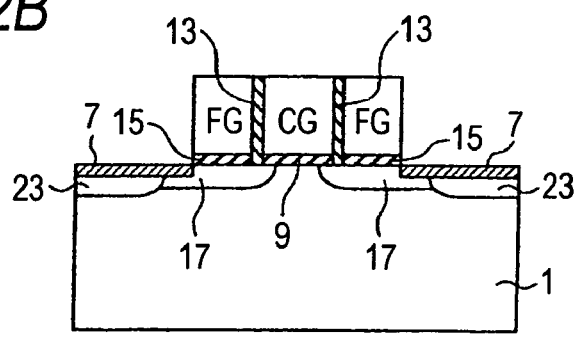
Figure 12C:
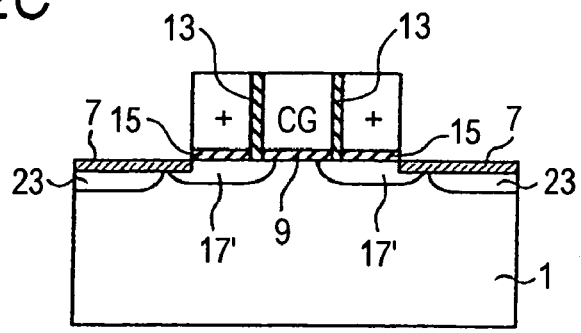
Figure 12D:
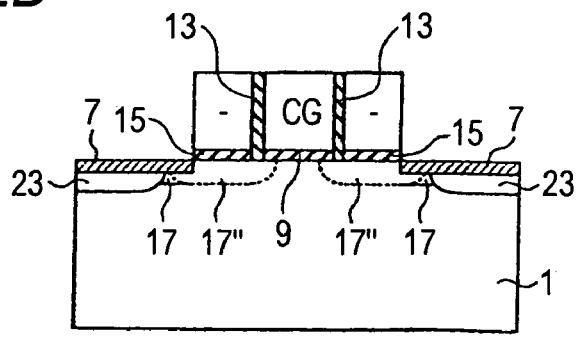

FIGS. 12A to 12D are sectional diagrams illustrating a storage element in modification 1.1, taken in the gate length direction. FIG. 12A shows the storage element of fixed information (1), FIG. 12B shows the storage element of fixed information (0), FIG. 12C shows the storage element of fixed information (1) and semi-fixed information (0), and FIG. 12D shows the storage element of fixed information (0) and semi-fixed information (1).

As shown in FIGS. 12A to 12D, the storage element in modification 1.1 comprises impurity diffusion layers 23 which are formed directly under the metal silicide layers 7 so as to be deeper than the impurity diffusion layers 17. Therefore, the contact areas between the metal silicide layers 7 and the semiconductor substrate 1 are reduced. Depletion layers are formed by junctions of the deep impurity diffusion layers 23 and the semiconductor substrate 1.

According to modification 1.1, it is possible to reduce a leakage current flowing between the metal silicide layers 7 and the semiconductor substrate 1. This effect is remarkable particularly in a storage element of fixed information (1).

Next, an example of a method of producing the storage element in modification 1.1 will be described with reference to FIGS. 13 to 18. For the sake of simplicity, ninth and subsequent steps which are different from those of the first embodiment will be described.

Figure 13:
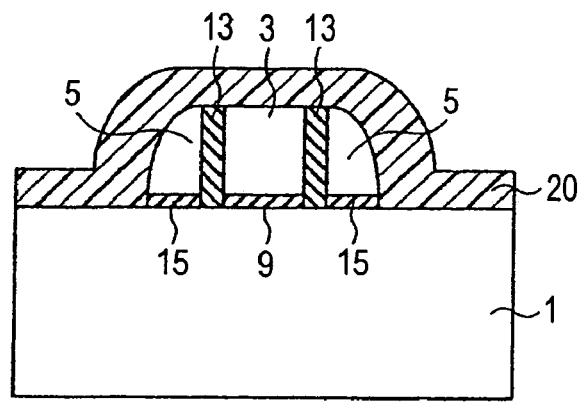
FIG. 13 is a sectional diagram showing a 9.1-th step of a process of producing the storage element in modification 1.1, taken in the gate length direction.

As shown in FIG. 13, in a 9.1-th step, a mask precursor layer 20 ($SiO_2$) is deposited.

Figure 14:
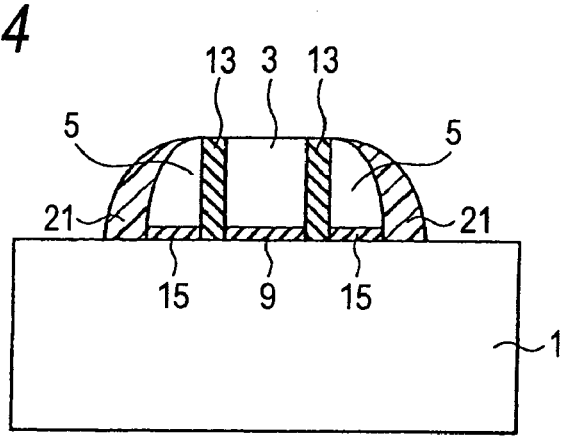
FIG. 14 is a sectional diagram showing a 9.2-th step of the process of producing the storage element in modification 1.1, taken in the gate length direction.

As shown in FIG. 14, in a 9.2-th step, the mask precursor layer 20 ($SiO_2$) is processed by anisotropic etching to form a mask 21 ($SiO_2$) on the side walls of the charge storage layers 5.

Figure 15:
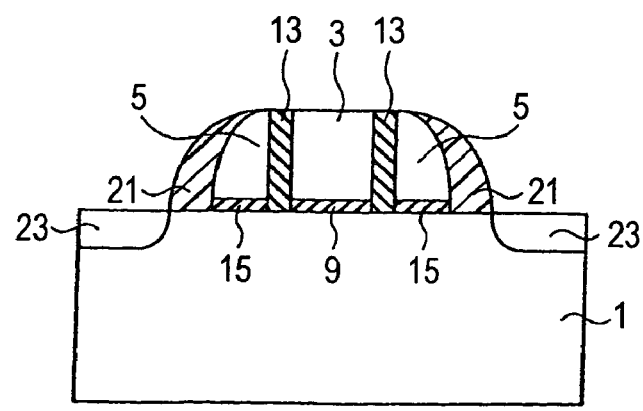
FIG. 15 is a sectional diagram showing a 9.3-th step of the process of producing the storage element in modification 1.1, taken in the gate length direction.

As shown in FIG. 15, in a 9.3-th step, As ions are implanted to form the deep impurity diffusion layers 23 in the exposed surface of the semiconductor substrate 1.

Figure 16:
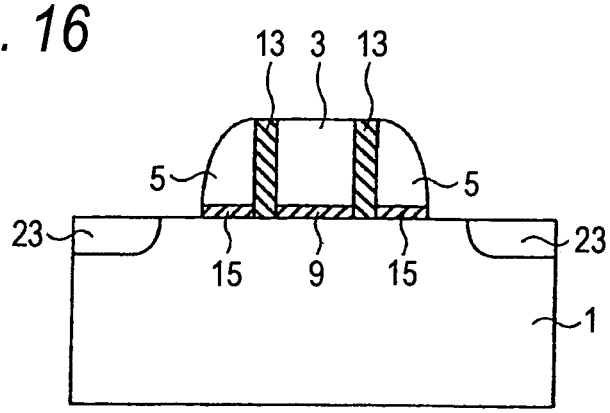
FIG. 16 is a sectional diagram showing a 9.4-th step of the process of producing the storage element in modification 1.1, taken in the gate length direction.

As shown in FIG. 16, in a 9.4-th step, the mask 21 ($SiO_2$) is removed away by etching.

Figure 17:
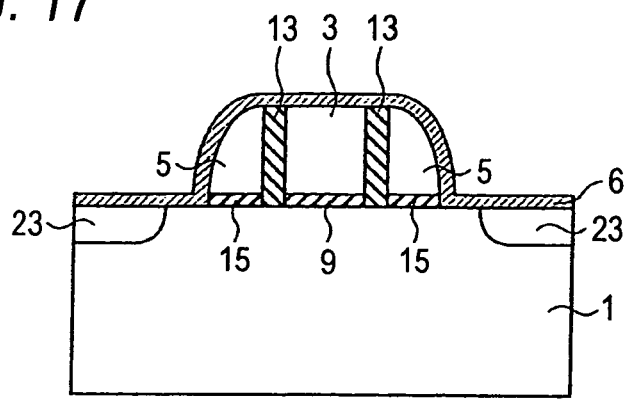
FIG. 17 is a sectional diagram showing a 9.5-th step of the process of producing the storage element in modification 1.1, taken in the gate length direction.

As shown in FIG. 17, in a 9.5-th step, the metal silicide precursor layer 6 (Co) is deposited.

Figure 18:
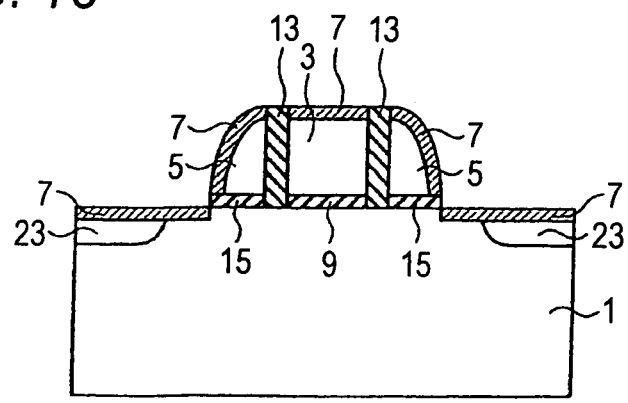
FIG. 18 is a sectional diagram showing a tenth step of the process of producing the storage element in modification 1.1, taken in the gate length direction.

As shown in FIG. 18, in a tenth step, the metal silicide precursor layer 6 (Co) which is in contact with the Si region is caused to undergo a silicide reaction by an annealing process, thereby forming the metal silicide layers 7 ($CoSi_2$). Thereafter, the unreacted Co is removed away.

As a result of the above-described steps, the storage element in modification 1.1 is produced.

Second Embodiment

A storage element in a second embodiment will be described with reference to FIGS. 19A to 19D. For the sake of simplicity, only portions which are different from those of the first embodiment will be described.

Figure 19A:
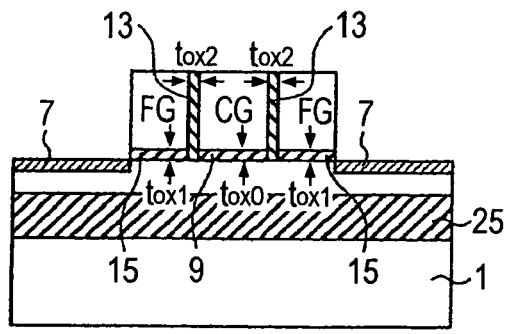
FIGS. 19A to 19D are sectional diagrams of a storage element in a second embodiment, taken in the gate length direction.
Figure 19B:
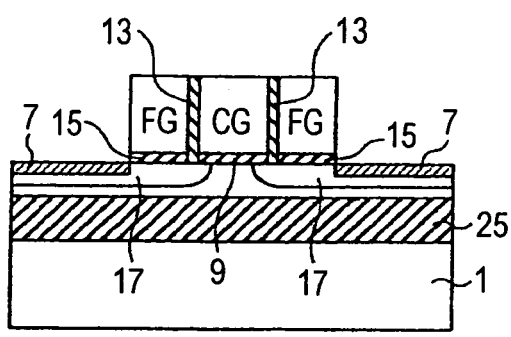
Figure 19C:
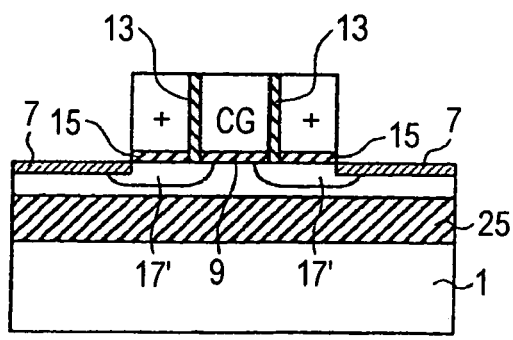
Figure 19D:
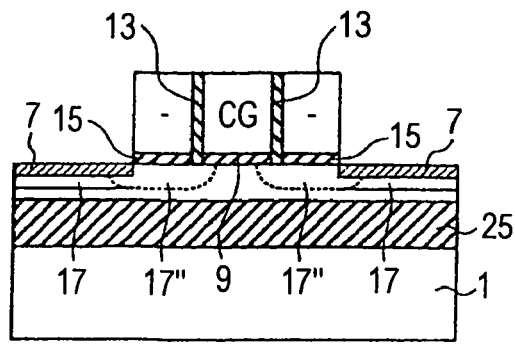

FIGS. 19A to 19D are sectional diagrams illustrating the storage element in the second embodiment, taken in the gate length direction. FIG. 19A shows the storage element of fixed information (1), FIG. 19B shows the storage element of fixed information (0), FIG. 19C shows the storage element of fixed information (1) and semi-fixed information (0), and FIG. 19D shows the storage element of fixed information (0) and semi-fixed information (1).

As shown in FIGS. 19A to 19D, in the storage element in the second embodiment, the semiconductor substrate 1 comprises an embedded insulating layer 25.

In the second embodiment, the region of the semiconductor substrate 1 which is directly under the pseudo impurity diffusion layers 17' and the depleted impurity diffusion layers 17" is narrowed, and hence the influences of the pseudo impurity diffusion layers 17' and the depleted impurity diffusion layers 17" can be enhanced. Moreover, leakage current passages under the pseudo impurity diffusion layers 17' and the depleted impurity diffusion layers 17" are narrowed, and hence a leakage current flowing between the metal silicide layers 7 and the semiconductor substrate 1 can be reduced.

Hereinafter, modification 2.1 will be described with reference to FIGS. 20A to 20D. For the sake of simplicity, only portions which are different from those of the second embodiment will be described.

Figure 20A:
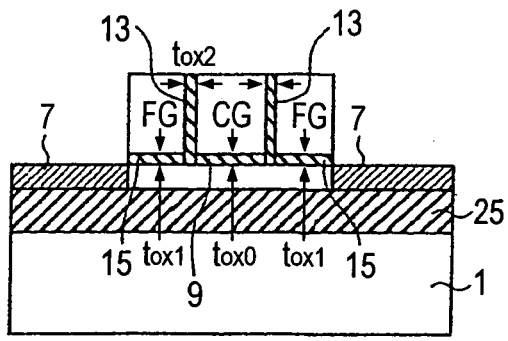
FIGS. 20A to 20D are sectional diagrams of a storage element in modification 2.1, taken in the gate length direction.
Figure 20B:
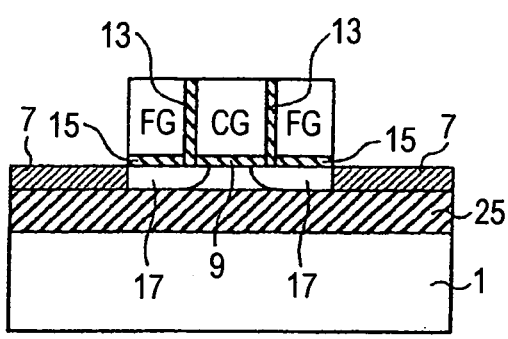
Figure 20C:
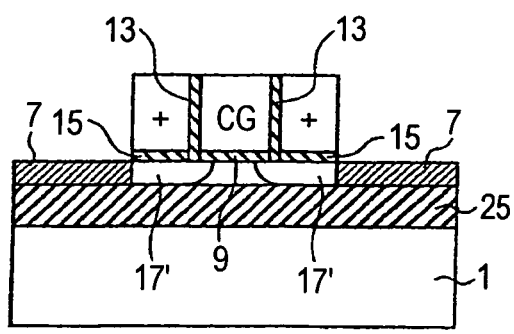
Figure 20D:
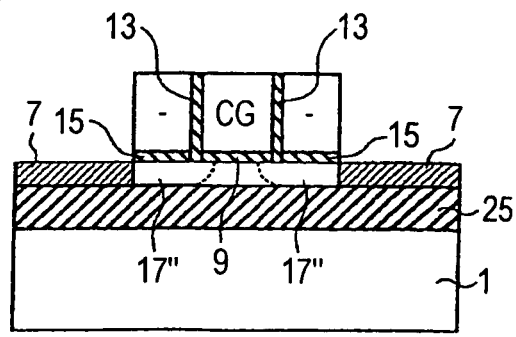

FIGS. 20A to 20D are sectional diagrams illustrating a storage element in modification 2.1, taken in the gate length direction. FIG. 20A shows the storage element of fixed information (1), FIG. 20B shows the storage element of fixed information (0), FIG. 20C shows the storage element of fixed information (1) and semi-fixed information (0), and FIG. 20D shows the storage element of fixed information (0) and semi-fixed information (1).

As shown in FIGS. 20A to 20D, in the storage element in modification 2.1, the embedded insulating layer is placed directly under the metal silicide layers 7. Therefore, the semiconductor substrate 1 does not exist in a portion directly under the pseudo impurity diffusion layers 17' and the depleted impurity diffusion layers 17". Moreover, the contact areas between the metal silicide layers 7 and the semiconductor substrate 1 are further reduced.

According to modification 2.1, as compared with the storage element in the second embodiment, the influences of the pseudo impurity diffusion layers 17' and the depleted impurity diffusion layers 17" can be enhanced. Furthermore, a leakage current flowing between the metal silicide layers 7 and the semiconductor substrate 1 can be reduced.

Hereinafter, modification 2.2 will be described with reference to FIGS. 21A to 21D. For the sake of simplicity, only portions which are different from those of the second embodiment will be described.

Figure 21A:
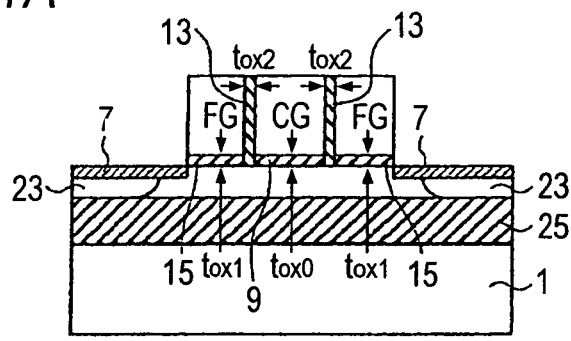
FIGS. 21A to 21D are sectional diagrams of a storage element in modification 2.2, taken in the gate length direction.
Figure 21B:
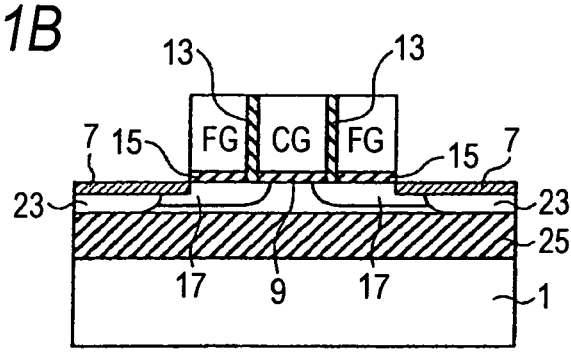
Figure 21C:
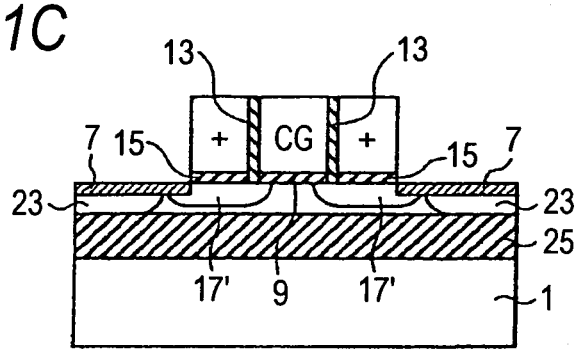
Figure 21D:
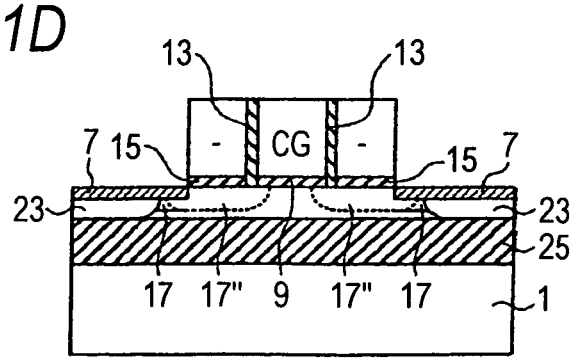

FIGS. 21A to 21D are sectional diagrams illustrating a storage element in modification 2.2, taken in the gate length direction. FIG. 21A shows the storage element of fixed information (1), FIG. 21B shows the storage element of fixed information (0), FIG. 21C shows the storage element of fixed information (1) and semi-fixed information (0), and FIG. 21D shows the storage element of fixed information (0) and semi-fixed information (0).

As shown in FIGS. 21A to 21D, in the storage element in modification 2.2, the deep impurity diffusion layers 23 are placed directly under the metal silicide layers 7, and the embedded insulating layer 25 is placed directly under the deep impurity diffusion layers 23. Therefore, depletion layers are formed in the vicinity of the junctions of the metal silicide layers 7 and the semiconductor substrate 1.

According to modification 2.2, as compared with the storage element in the second embodiment, a leakage current flowing between the metal silicide layers 7 can be reduced.

Third Embodiment

A storage element in a third embodiment will be described with reference to FIGS. 22A to 22D. For the sake of simplicity, only portions which are different from those of the first embodiment will be described.

Figure 22A:
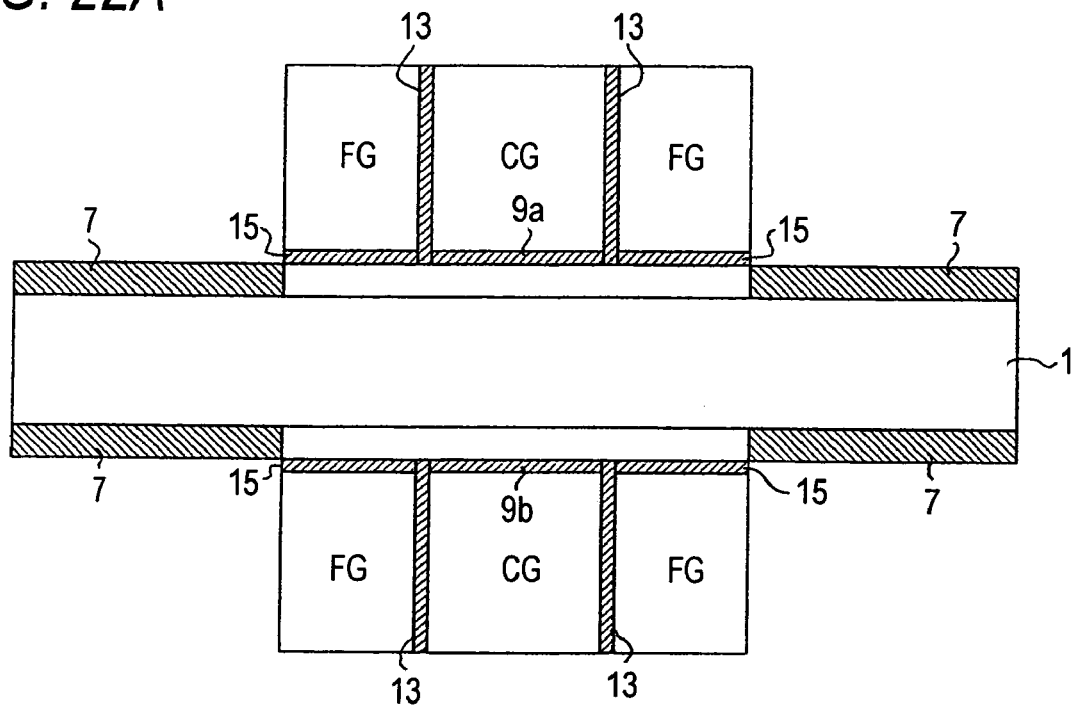
FIGS. 22A to 22D are sectional diagrams of a storage element in a third embodiment, taken in the gate length direction.
Figure 22B:
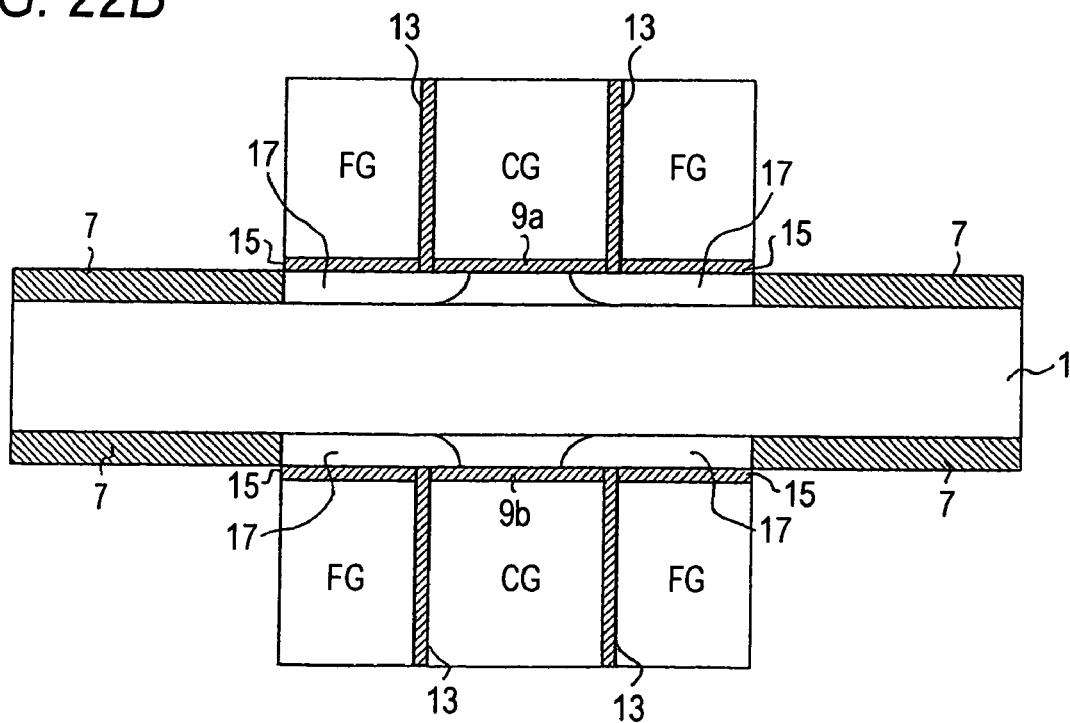
Figure 22C:
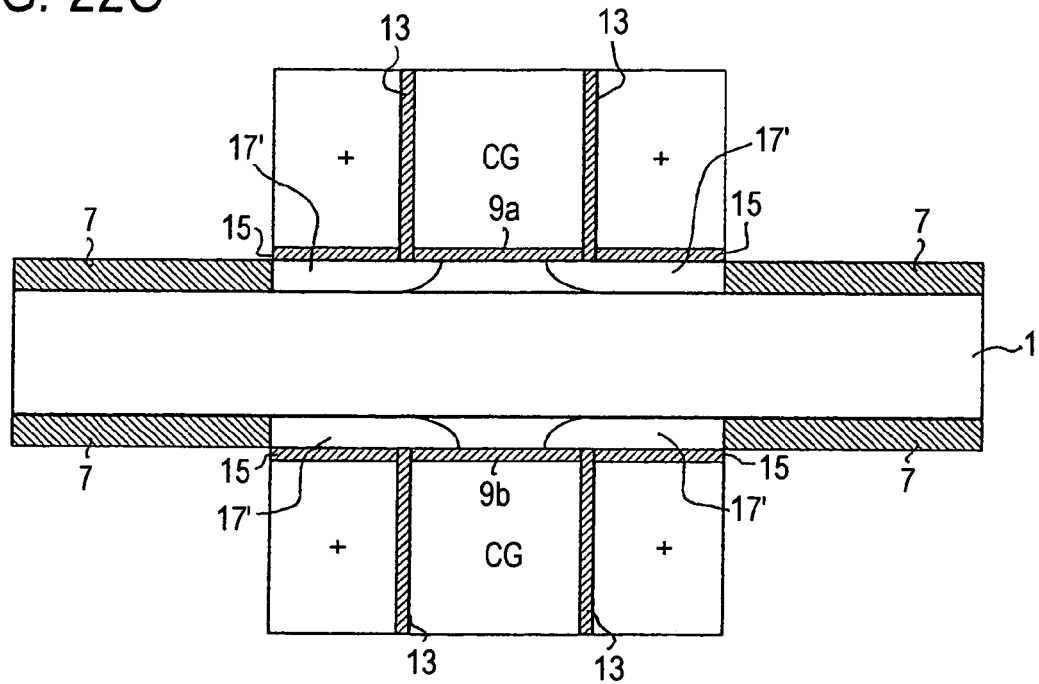
Figure 22D:
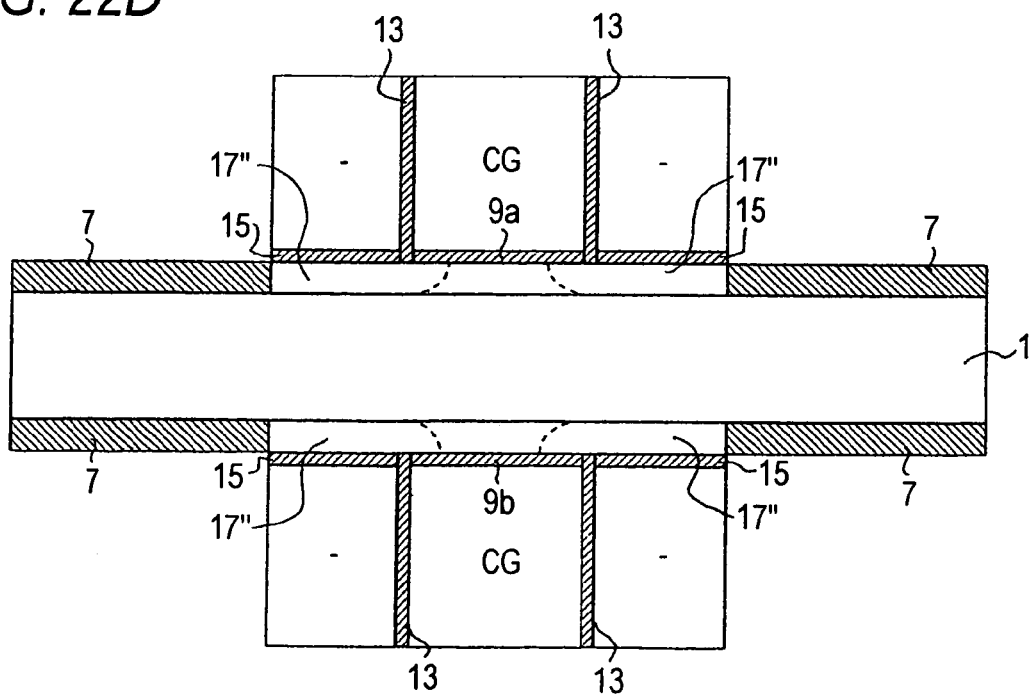

FIGS. 22A to 22D are sectional diagrams illustrating the storage element in the third embodiment, taken in the gate length direction. FIG. 22A shows the storage element of fixed information (1), FIG. 22B shows the storage element of fixed information (0), FIG. 22C shows the storage element of fixed information (1) and semi-fixed information (0), and FIG. 22D shows the storage element of fixed information (0) and semi-fixed information (1).

As shown in FIGS. 22A to 22D, the storage element in the third embodiment has a so-called double-gate structure. The gate insulating film 9 is configured by a first gate insulating film 9a on the semiconductor substrate 1, and a second gate insulating film 9b under the semiconductor substrate 1. The gate electrode (CG) has a first gate electrode (CG) on the first gate insulating film 9a, and a second gate electrode (CG) under the second gate insulating film 9b. The charge storage layers (FG) are formed on both the side faces in the gate length direction of each of the first and second gate electrodes (CG) via the control insulating films 13, respectively. Tunnel insulating films 15 are formed between the charge storage layers (FG) and the semiconductor substrate 1. Impurity diffusion layers 17 are formed in portions of the semiconductor substrate 1 interposed between the charge storage layers (FG), and metal silicide layers 7 are formed so as to sandwich the respective impurity diffusion layers 17 of the semiconductor substrate 1.

According to the third embodiment, the influences of the pseudo impurity diffusion layers 17' and the depleted impurity diffusion layers 17" are enhanced, and a leakage current can be reduced.

A simulation was conducted on the storage element in the third embodiment to check the state of the Schottky barrier.

Figure 23:
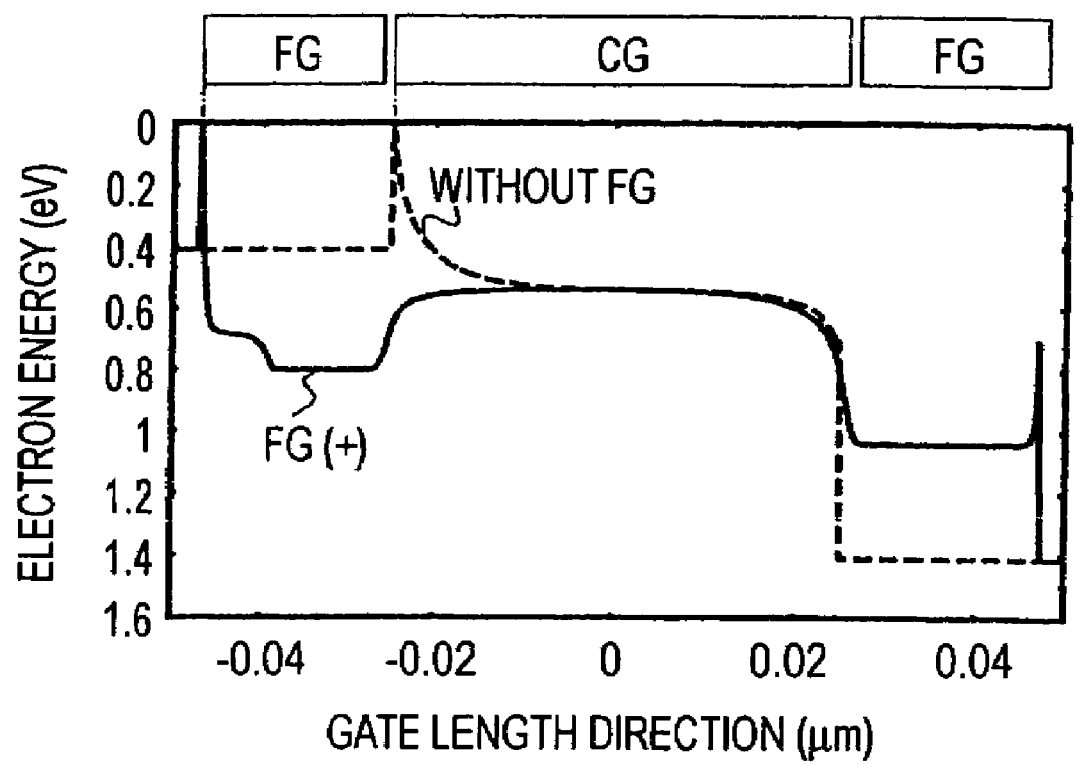
FIG. 23 is a diagram of a simulated electron energy distribution in the storage element in the third embodiment.

FIG. 23 is a diagram of a simulated electron energy distribution in the storage element in the third embodiment. In the storage element on which the simulation was conducted, the gate electrode has a length of 50 nm, the semiconductor substrate has a thickness of 10 nm, and the impurity concentration of the semiconductor substrate is $10^{15}$ cm$^{-3}$ of B. The voltage application was done under the conditions of the gate voltage of 1 V and the drain voltage of 1 V.

The solid line shows the electron energy distribution in the case where the charge storage layers (FG) of the storage element shown in FIG. 22C store positive charges having a potential of 2 V. The Schottky barrier is steep in the left end of the source charge storage layer (FG). By contrast, the broken line shows the electron energy distribution in the case where the charge storage layers (FG) are not formed. The Schottky barrier in the left end of the gate electrode (CG) is thick.

From the above, it was ascertained that the Schottky barrier can be thinned by disposing charge storage layers (FG) on both sides of a gate electrode, and storing positive charges. Therefore, it will be seen that, in the third embodiment, the amount of ON-current in the storage element of semi-fixed information (0) is increased.

Although the embodiments of the invention have been described above, the invention is not restricted to them, and can be variously changed within the spirit and scope of the invention set forth in the appended claims. In implementation phase, moreover, the invention can be variously modified without departing its spirit.

What is claimed is:

1. A semiconductor memory device comprising:
   a semiconductor substrate;
   a gate insulating film on the semiconductor substrate;
   a gate electrode on the gate insulating film;
   control insulating films which are formed on both side faces in a gate length direction of the gate electrode, respectively;
   charge storage layers which are formed on both the side faces in the gate length direction of the gate electrode via the control insulating films, respectively;
   a tunnel insulating film which is formed between the charge storage layers and the semiconductor substrate; and
   source/drain regions between which the gate electrode and the charge storage layers are interposed in the gate length direction, and which are formed in a surface of the semiconductor substrate, wherein fixed information is stored depending on presence/absence of an impurity diffusion layer formed in a surface portion of the semiconductor substrate directly under the tunnel insulating film, semi-fixed information is stored depending on an amount of charges in the charge storage layers, and charges which are opposite in polarity to charges in the charge storage layers are induced in a surface portion of the semiconductor substrate directly under the tunnel insulating film.

2. A semiconductor memory device according to claim 1, wherein
the device further comprises an insulating layer in the semiconductor substrate under the source/drain regions, the control insulating films, and the gate insulating film.

3. A semiconductor memory device according to claim 1, wherein
the control insulating films are larger in thickness than the tunnel insulating film, and the control insulating films are larger in area than the tunnel insulating film.

4. A semiconductor memory device according to claim 1, wherein
dielectric constants of the control insulating films are larger than a dielectric constant of the tunnel insulating film.

5. A semiconductor memory device according to claim 2, wherein
the control insulating films are larger in thickness than the tunnel insulating film, and the control insulating films are larger in area than the tunnel insulating film.

6. A semiconductor memory device according to claim 2, wherein
dielectric constants of the control insulating films are larger than a dielectric constant of the tunnel insulating film.

7. A semiconductor memory device according to claim 2, wherein
the source/drain regions are conductors which cooperate with the semiconductor substrate to form a Schottky junction.

8. A semiconductor memory device according to claim 3, wherein
the source/drain regions are conductors which cooperate with the semiconductor substrate to form a Schottky junction.

9. A semiconductor memory device according to claim 4, wherein
the source/drain regions are conductors which cooperate with the semiconductor substrate to form a Schottky junction.

10. A semiconductor memory device according to claim 5, wherein
the source/drain regions are conductors which cooperate with the semiconductor substrate to form a Schottky junction.

11. A semiconductor memory device according to claim 6, wherein
the source/drain regions are conductors which cooperate with the semiconductor substrate to form a Schottky junction.

12. A semiconductor memory device according to claim 1, wherein
the charge storage layers are floating gates.

13. A semiconductor memory device according to claim 2, wherein
the charge storage layers are floating gates.

14. A semiconductor memory device comprising:
a semiconductor substrate;
a first gate insulating film on the semiconductor substrate, and a second gate insulating film under the semiconductor substrate;
a first gate electrode on the first gate insulating film, and a second gate electrode under the second gate insulating film;
first charge storage layers which are formed on both side faces in a gate length direction of the first gate electrode via control insulating films, respectively;
second charge storage layers which are formed on both side faces in a gate length direction of the second gate electrode via control insulating films, respectively;
a first tunnel insulating film which is formed between the first charge storage layers and the semiconductor substrate; and
a second tunnel insulating film which is formed between the second charge storage layers and the semiconductor substrate, wherein
source/drain regions between which respective one of the first and second gate electrodes, and respective one of the first and second charge storage layers are interposed in the gate length direction are formed in surfaces of the semiconductor substrate,
impurity diffusion layers are formed between the first and second tunnel insulating films, and in the semiconductor substrate, and
charges which are opposite in polarity to charges in the first charge storage layers, and charges which are opposite in polarity to charges in the second charge storage layers are induced in surface portions of the semiconductor substrate directly under the first and second tunnel insulating films, respectively.

15. A semiconductor memory device according to claim 14, wherein
the control insulating films are larger in thickness than the first tunnel insulating film or the second tunnel insulating film, and the control insulating films are larger in area than the first tunnel insulating film or the second tunnel insulating film.

16. A semiconductor memory device according to claim 14, wherein
dielectric constants of the control insulating films are larger than a dielectric constant of the first tunnel insulating film or the second tunnel insulating film.

17. A semiconductor memory device according to claim 14, wherein
the source/drain regions are conductors which cooperate with the semiconductor substrate to form a Schottky junction.

18. A semiconductor memory device according to claim 15, wherein
the source/drain regions are conductors which cooperate with the semiconductor substrate to form a Schottky junction.

19. A semiconductor memory device according to claim 16, wherein
the source/drain regions are conductors which cooperate with the semiconductor substrate to form a Schottky junction.

20. A semiconductor memory device according to claim 14, wherein
the charge storage layers are floating gates.

* * * * *